(12) United States Patent
Doljack et al.

(10) Patent No.: US 10,345,344 B2
(45) Date of Patent: Jul. 9, 2019

(54) MAGNETIC SENSOR WITH THIN-WALLED MAGNETIC CORE AND METHODS OF MANUFACTURE

(71) Applicant: EATON INTELLIGENT POWER LIMITED, Dublin (IE)

(72) Inventors: Frank Anthony Doljack, Pleasanton, CA (US); Ramdev Kanapady, Campbell, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 1497 days.

(21) Appl. No.: 14/245,614

(22) Filed: Apr. 4, 2014

(65) Prior Publication Data

US 2015/0285841 A1 Oct. 8, 2015

(51) Int. Cl.
*G01R 15/18* (2006.01)
*G01R 15/20* (2006.01)

(52) U.S. Cl.
CPC ......... *G01R 15/202* (2013.01); *G01R 15/207* (2013.01)

(58) Field of Classification Search
CPC ......... H01L 24/45; H01L 24/48; H01L 24/49; G01R 33/05; G01R 33/09; G01R 15/205; G01R 33/1215; G01R 33/34084; G01R 33/341; G01R 33/36; G01R 33/3808; G01R 15/207; G01R 15/183; G01R 15/202; G01R 19/0092; G01R 33/04; G01R 33/243; G01R 33/302; G01R 33/3806; G01R 33/383; G01R 33/02; G01R 33/072; G01R 15/18; G01R 19/00; H01F 41/046; H01F 27/2804; H01F 17/0033; H01F 27/24; H01F 38/30; H01F 27/245; H01F 2017/0066; H01F 41/0213; H01F 5/00; H01F 2027/2819; H01F 27/25; H01F 27/367; H01F 41/0226; H01F 41/0233; H01F 41/042; H01F 17/04; G01N 24/08; B60R 16/02; G06F 3/03546
See application file for complete search history.

(56) References Cited

U.S. PATENT DOCUMENTS

| | | | |
|---|---|---|---|
| 4,398,342 A * | 8/1983 | Pitt | H01L 43/14 257/425 |
| 7,176,672 B2 | 2/2007 | Brandt | |
| 2012/0217963 A1* | 8/2012 | Naka | G01R 15/207 324/253 |

(Continued)

FOREIGN PATENT DOCUMENTS

| | | | | |
|---|---|---|---|---|
| JP | 2009300196 | * | 12/2009 | ............. G01R 15/02 |
| JP | 2010266209 A | | 11/2010 | |
| WO | WO2013175865 | * | 11/2013 | ............. G01R 31/19 |

OTHER PUBLICATIONS

Product Data Sheet for A90DC Series DC Current Monitor; Obvius; Date Unknown; 2 pages.

(Continued)

*Primary Examiner* — Vinh P Nguyen
(74) *Attorney, Agent, or Firm* — Armstrong Teasdale LLP

(57) ABSTRACT

A non-contact magnetic sensor assembly includes a thin-walled magnetic ring that facilitates a reduction in the size of the device without compromising performance. The component assembly may be configured as a Hall effect current sensor and may be included in a string monitor for a photovoltaic power system.

57 Claims, 9 Drawing Sheets

(56) References Cited

U.S. PATENT DOCUMENTS

2012/0319674 A1 12/2012 El-Essawy et al.
2013/0076343 A1 3/2013 Carpenter et al.

OTHER PUBLICATIONS

Carpenter HyMu "80"® Alloy; http://cartech.ides.com/datasheet; CRS Holdings, Inc., a subsidiary of Carpenter Technology Corporation; 2013; 4 pages.
Installation Instructions for the SS490 Series Miniature Ratiometric Linear Hall Effect Sensors; Issue 4, PK 88840; Honeywell Inc.; Date Unknown; 4 pages.

* cited by examiner

MAGNETIC SENSOR WITH THIN-WALLED MAGNETIC CORE AND METHODS OF MANUFACTURE

BACKGROUND OF THE INVENTION

The field of the invention relates generally to magnetic components configured as transducers, and more specifically to non-contact sensors such as Hall effect current sensor devices for electrical sensing applications.

Hall effect sensors are known and in widespread use as transducers in a variety of sensing applications. Hall effect sensors typically include a housing, a magnetic core element including a gap, and a Hall element in the gap. The housing and the magnetic core are formed with an opening through which an electrical conductor, such as a wire or cable may be passed. When electrical current flows through the conductor, a magnetic field is generated that varies with the amount of current flow. The magnetic field is concentrated in the gap of the core element and measured by the Hall element. When subjected to a magnetic field associated with the current flow in the conductor, the Hall element responds with an output voltage proportional to the magnetic field strength. The output voltage is typically small and requires additional electronics to achieve useful voltage levels. When the Hall element is combined with the associated electronics, it forms a Hall effect sensor.

By monitoring the output voltage of the Hall effect sensor, the magnitude of the electrical current flowing through the conductor can be determined. The electrical current is measured without electrical contact with the primary circuit, providing galvanic isolation. Hall effect sensors can be used in both open loop and closed loop feedback configurations to monitor and control aspects of electric power systems. In various other applications, Hall effect sensors can be adapted for use as temperature, sensors, pressure sensors, position sensors, etc. A Hall effect sensor can reliably detect any quantity or parameter that can be sensed which incorporates or can incorporate a magnetic field.

In certain applications, known Hall effect sensors are disadvantaged and improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION OF THE INVENTION

Figure 1:
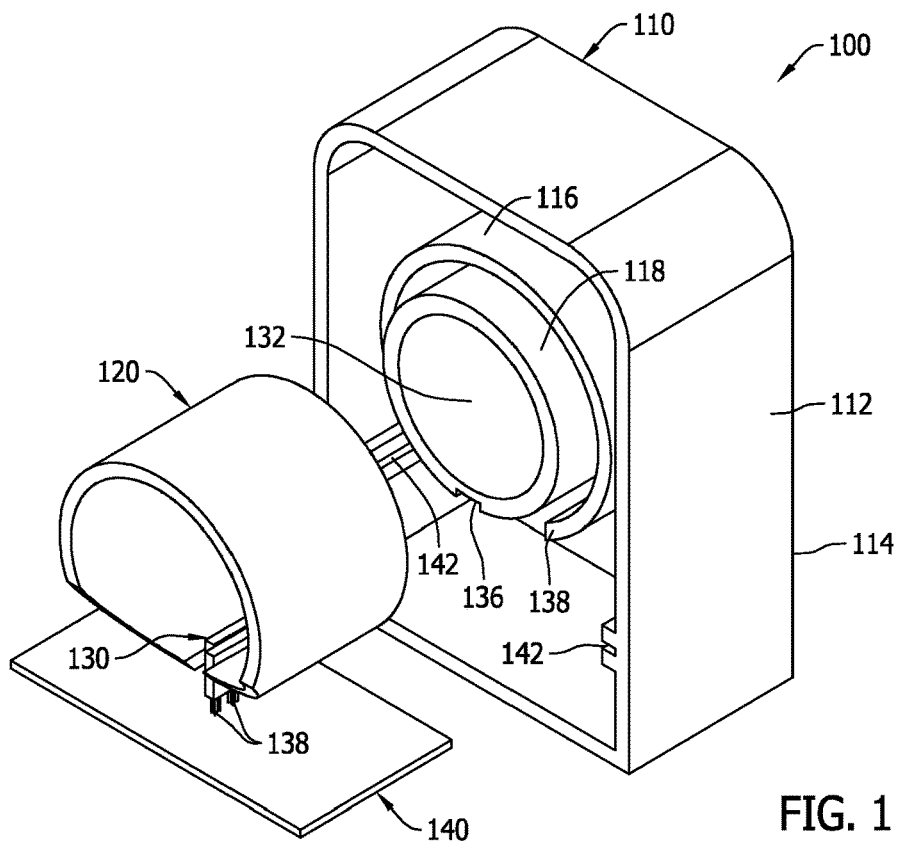
FIG. 1 is an assembly view of a magnetic component assembly according to a first exemplary embodiment of the present invention.

An exemplary application of Hall effect sensors includes, but is not limited to, monitoring of current in a photovoltaic power system. According to well-known methods, photovoltaic power systems convert solar radiation into direct current (DC) electrical power using semiconductors that exhibit a photovoltaic effect. Photovoltaic power generation employs solar panels composed of a number of solar cells containing a photovoltaic material. A number of solar panels may be arranged in an array, and the operation of the panels may be monitored with open loop Hall effect current sensors.

In some scenarios, Hall effect current sensors may be utilized in a multiple string current monitor utilized in smart combiner boxes to detect when panels in a solar photovoltaic system are underperforming. As such, the string current monitor may detect current flow in a plurality of conductors, analyze the current flow for potential issues, and/or communicate the data to another device for such analysis. The data may be made available to human operators in real time so that corrective actions, system maintenance and appropriate system oversight can be promptly made. The string monitor may include capabilities such as operating and maintenance tools and applications for use by power system personnel, generation of key panel performance and production parameters, quick identification and diagnosis of panel issues needing attention, generation of alarm notification to key personnel, communication of data to smart combiner box manufacturer, and battery monitoring capabilities to assess the health of the photovoltaic system. Such string monitors are commercially available, for example, from Obvious of Tualatin, Oreg. (www.obvius.com). The A90DC Series Current Monitor of Obvious is one example of a known string monitor including conventional Hall effect current sensor devices, and may monitor, for example, up to 12 solar strings simultaneously.

Known open loop Hall effect current sensors are, however, relatively bulky devices with a relatively large outside diameter and a small inside diameter. This is typically because magnetic cores utilized in known Hall effect sensor constructions also include relatively large outside diameters compared to their inside diameters. The material chosen to fabricate the magnetic core, usually into a toroidal configuration, typically has a very high magnetic permeability and a very small coercive force. The thickness of the magnetic cores (i.e., half the difference between their outside and the inside diameters) is typically strategically selected in view of the particular materials utilized to fabricate the core and the sensitivity of the Hall element that is placed in the core gap. It is important for the core to provide sufficient flux for detection by the Hall element in order for the Hall effect current sensor to reliably operate. Efforts to reduce the size of the magnetic core elements have therefore become practically limited on the belief that further reducing the size of the core would raise performance issues for the current sensors in operation. Also, efforts to reduce the size of the magnetic core elements using conventional core fabrication techniques tend to be fraught with manufacturing complications and expense that are desirably avoided.

In applications such as solar string current monitors where many current sensors are utilized side-by-side, however, the size of conventional Hall effect current sensors directly affects the size of the string monitors including them. Because of the bulky size of conventional Hall effect current sensors, the center-to-center spacing of the wires/conductors that loop through the current sensors is necessarily relatively large, which in turn makes the overall length of the string monitor relatively large. It would be desirable to provide smaller Hall effect current sensor devices to facilitate a reduction in center-to-spacing of the wires in an array to facilitate a reduction in size of a current string monitor. More efficient use of space in photovoltaic power systems would be highly desirable.

Exemplary embodiments of a Hall effect current sensor are described hereinbelow that overcome the disadvantages in the art discussed above. Beneficially, the exemplary embodiments of the Hall effect current sensors described below include thin-walled magnetic cores facilitating size reduction of the current sensor devices while providing acceptable performance and relatively simple manufacturing processes and assembly at a reasonable cost. Method aspects will be in part apparent and in part explicitly discussed in the description below.

While described in the context of string monitors for DC photovoltaic power systems, other applications may benefit from smaller magnetic non-contact current sensor devices, including but not limited to alternating current (AC) power system monitors and controls. The exemplary photovoltaic string monitor application is presented for the sake of illustration rather than limitation. Also, while described in the context of Hall effect current sensors, Hall effect sensors for other purposes (i.e., non-current sensing such as temperature, sensors, pressure sensors, position sensors, etc. are contemplated within the scope of the present invention. Magnetic sensors and transducers of other types (i.e., non-Hall effect sensors) may also benefit from the subject matter disclosed and the teachings below may be incorporated to provide such magnetic sensors and transducers of other types. Magnetic components such as current transformers may also benefit from the reduced core construction size described below and the teachings below can accordingly be adapted to provide still other magnetic components.

Figure 2:
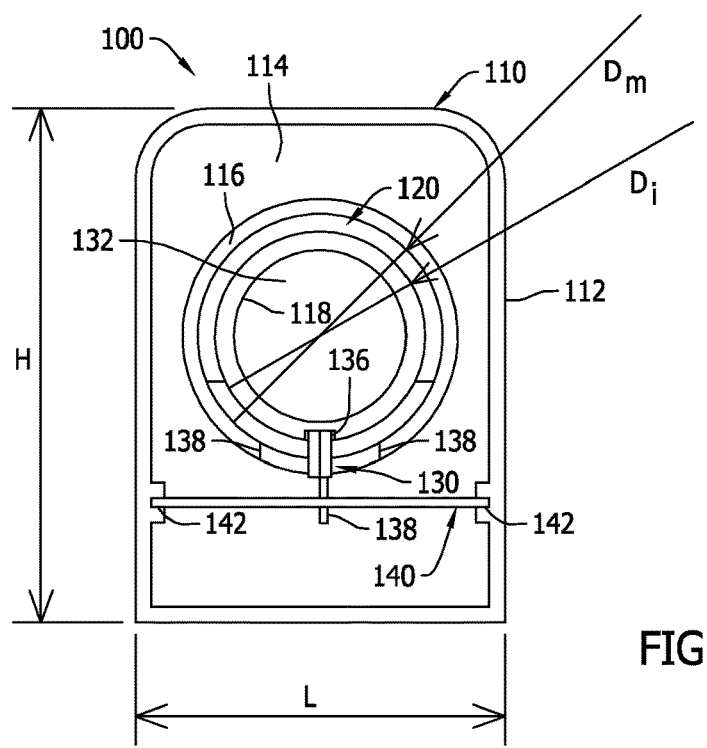
FIG. 2 is a front elevational view of the assembly shown in FIG. 1.
Figure 3:
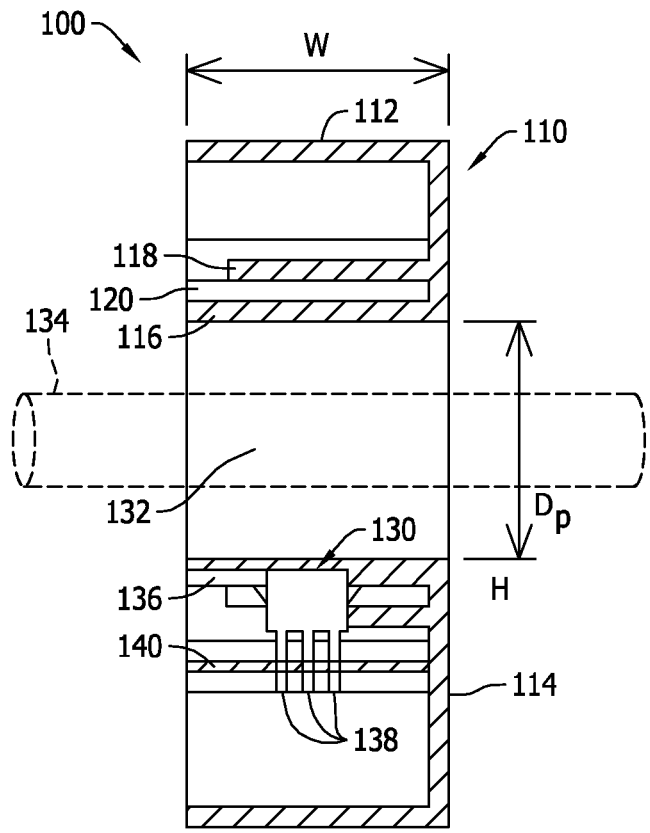
FIG. 3 is a cross-sectional view of the assembly shown in FIG. 2 taken along the line A-A.
Figure 10:
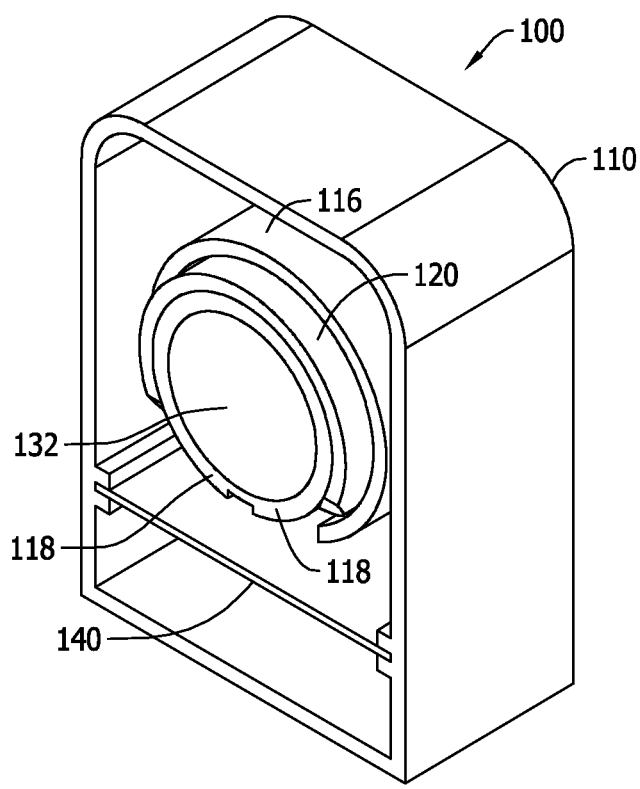
FIG. 10 is a front perspective view of the completed component shown in FIG. 1.

FIG. 1 is an assembly view of an exemplary magnetic component assembly 100 configured as transducer, and more specifically is configured as a Hall effect sensor assembly according to a first exemplary embodiment of the present invention. FIG. 2 is a front elevational view of the magnetic component assembly 100 shown in FIG. 1. FIG. 3 is a cross-sectional view of the magnetic component assembly 100 shown in FIG. 2 taken along the line A-A. FIG. 10 shows the completed component assembly 100 from a front perspective view.

In the example shown, the magnetic component assembly 100 generally includes a housing 110, a thin-walled magnetic core element 120, a Hall sensor element 130 installed in a gap of the core element 120, and a Hall sensor printed circuit board 140.

The housing 110 in the example shown is fabricated from an electrically nonconductive material such as plastic according to known techniques such as molding, and in the example shown includes an outer wall 112 extending in an inverted U-shape in the drawings of FIGS. 1-3, a rear wall 114, an intermediate wall 116 extending from the rear wall, and an inner wall 118. The inner wall 118 and the intermediate wall 116 define a space therebetween that receives the magnetic core element 120 as best seen in FIG. 2.

The inner wall 118 is generally cylindrical and completes a circumferential surface extending 360° about a center point to define an interior, cylindrical opening or passageway 132 from the front of the housing to the opposing rear wall 114. In the example shown, the interior surface of the inner wall has an outer diameter $D_p$ of about 11.5 mm as seen in FIG. 3, and an exterior surface of the inner wall 118 has an outer diameter $D_i$ of about 14 mm as shown in FIG. 2. The passageway 132 may receive an electrical conductor 134 (shown in phantom in FIG. 3) such as a wire conductor or conductor cable therethrough. When the conductor 134 is passed through the passageway 132 and when electrical current flows through the conductor 134, a magnetic field is generated that may be measured with the Hall element 130 and the Hall sensor printed circuit board 140.

The inner wall 118 also includes an outwardly extending rectangular slot 136 on its outer surface at the bottom thereof (i.e., on the outer surface at about the 180° position from its highest point at the top of the housing 110). The rectangular slot 136 receives a portion of the Hall element 130. The slot 130 extends inwardly from the outer radius $D_i$ and accommodates a portion of the height of the Hall element 130.

The Hall element 130 may be a commercially available Hall element such as an SS490 Series Miniature Ratiometric Liner Hall Effect element available from Honeywell Inc. of Freeport Ill. Other Hall elements are known, however, and may be utilized. When installed to the core element 120 and to the housing 110, output pins 138 of the Hall element 130 extend radially or perpendicularly from the axis of the passageway 132 through which the conductor 134 is extended. The output pins 138 of the Hall element are received in through holes on the Hall sensor printed circuit board 140 to establish electrical connection therewith. In other embodiments, other types of sensors may be utilized in combination with the magnetic core element 120 to detect a parameter of interest, including but not limited to electrical current flow through the conductor 134.

The Hall sensor printed circuit board 140 includes an amplifier and circuitry to effect the measurement of the current that generates the magnetic field detected by the Hall element. Suitable circuitry for the board 140 is commonly known and available. As the construction and operation of the circuitry is well-known and understood, further discussion thereof is not believed to be necessary. While in the embodiment described, the circuit board 140 is configured to implement a Hell effect current sensor, other configurations are possible and may likewise be utilized in the component assembly 100.

The intermediate wall 116 of the housing 110 is generally cylindrical and defines a curved, circumferential, major surface that extends a bit less than 360° about the inner wall 118 in a spaced relation therefrom. The intermediate wall 116 defines an interior, cylindrical opening or passageway having an inner diameter $D_m$ of about 16 mm as seen in FIG. 3. The intermediate wall 116 terminates at opposing ends 138 near the bottom of the interior wall 118 to provide a space or clearance for the Hall element 130. As best shown in FIGS. 1 and 3, the intermediate wall 116 is slightly recessed relative to the inner wall 118 of the housing 110. In other words, the intermediate wall 116 projects from the rear wall 114 for a shorter distance than does the inner wall 118.

Also in the example shown, slots 142 are also formed on opposing and generally parallel, interior surfaces of the U-shaped outer wall 112 of the housing 110. The slots 142 receive respective ends of the Hall sensor printed circuit board 140 when assembled. The front side of the housing 110, opposing the rear wall 114, is open and unobstructed to facilitate the assembly of the component 100 as illustrated in the perspective view of FIG. 10. A nonconductive cover piece (not shown) may optionally be provided on the open front if desired, and the open bottom side of the housing 110 as shown may optionally be closed with another side wall or another cover piece, but if the component assembly 100 is located inside a protective housing of another device, such as a string monitor (FIG. 11) no such cover piece is necessary.

The exemplary component 100 shown in FIGS. 1-3 has an exemplary length dimension L of about 25 mm, measured in a direction perpendicular to the axis of the passageway 132 through which the conductor 134 is extended, perpendicular to the opposing sides or legs of the U-shaped outer wall 112 of the housing 110, and parallel to the top side of the inverted U-shaped outer wall 112 of the housing 110. Because of the thin-walled magnetic core element 120 as further described below, the length dimension L may be considerably smaller than conventional fabricated components having conventional, thicker-walled toroidal cores having larger external diameters. The reduced length dimension L allows more components 100 to be located side-by-side in the string monitor (or an alternative application) in a given amount of space than is otherwise possible using conventional components having larger cores and correspondingly larger length dimensions. In other words, when multiple components 100 are positioned side-by-side (i.e., when the opposing sides or legs of the U-shaped outer wall 112 of the housing 110 are substantially abutted to one another) the center-to-center spacing of conductors 134 extending through each passageway 132 may be reduced by virtue of the smaller length dimension L of each component 100.

The exemplary component 100 shown in FIGS. 1-3 has an exemplary height dimension H of about 39 mm measured in a direction perpendicular to the axis of the passageway 132 through which the conductor 134 is extended, parallel to the opposing sides or legs of the U-shaped outer wall 112 of the housing 110, and perpendicular to the top side of the inverted U-shaped outer wall 112 of the housing 110. Also, the Hall sensor printed circuit board 140 in the example shown is elevated from an open bottom end of the housing 110 to facilitate assembly with and electrical connection to another device such as a string monitor (FIG. 11) of a photovoltaic power system. The elevated circuit board 140 in the arrangement shown increases the height dimension H of the component 100, and in other embodiments the elevation could be considered optional to further reduce the height dimension H. Numerous variations are possible to raise or lower the relative position of the passageway 132 in the component 100 as desired.

The exemplary component 100 shown in FIGS. 1-3 has an exemplary width dimension W of about 13 mm measured in a direction parallel to the axis of the passageway 132. The width dimension W in this example is slightly larger than the diameter $D_p$ of the passageway 132, about 50% less than the length dimension L, and about a third of the height dimension H. Other proportions are possible and may be utilized in other embodiments.

While the component assembly 100 is considerably more compact than known components for similar purposes, it is noted that the length dimension L of the exemplary component 100 shown in FIGS. 1-3 could be reduced even further for still further size reduction of the housing 110 and the completed component assembly 100. The width dimension L, for example, may be as small as 18 mm in another embodiment and still easily accommodate the outer diameter of the core element 102 (16 mm in this example) while keeping the other dimensions the same. That is, while the drawing shows an overall housing width of 25 mm, it is clear that this dimension can be reduced by more than 25% to about 18 mm while maintaining the inside diameter of the opening at 11.5 mm as shown. As such, a large diameter, current-carrying conductor 134 (FIG. 2) can be accommodated in the passageway 132 while at the same time providing insulation between the conductor 134 and the magnetic core element 120 and Hall element 130 as well as keeping the overall length of the final component assembly 100 to about 18 mm. Electrical insulation is an important requirement for the component assembly 100 in use. In the case of the solar string monitor (FIG. 11) the conductor 134 may be subject to a voltage up to 1500 VDC. As one can see by studying the drawing the wall thickness of the inner wall 118 and intermediate wall 116 of the housing 110 provide such insulation, with slight increase to the overall length W of the assembly.

While exemplary dimensions of the housing 110 have been disclosed, they are exemplary only. Greater or lesser length values L, as well as width and height dimensions H and W may be provided to accommodate the same or different core element 120 with respective inner and outer diameter. The respective diameters of the inner wall 118 and the intermediate wall 116 may also be adjusted to accommodate the same or different core element 120 with respective inner and outer diameter.

The thin-walled magnetic core element 120 as seen in FIGS. 1-3 is generally cylindrical and completes circumferential surface defining a nearly 360° loop about a center point thereof. The magnetic core element 120 is inserted between the inner wall 118 and the intermediate wall 116 of the housing 110 and occupies the space in between. The magnetic core element 120 in the example shown has an outer radius about equal to the inner diameter $D_m$ of the intermediate wall 116 (about 16 mm in the example shown) and an inner diameter about equal to the outer diameter $D_i$ of the inner wall 118 (about 14 mm in the example shown). Alternatively stated, the outer or external surface of the magnetic core element 120 in the example shown extends at an outer radius of 8 mm and an inner or internal surface extends at an inner radius about equal to 7 mm in the example shown. In other words, the magnetic core element 120 has a thickness measured in the radial direction of only about 1 mm that is substantially less than conventional cores used in otherwise similar components. As noted above, the substantial reduction in thickness of the core element 120, in turn, facilitates substantial size reduction of the housing 110 needed to accommodate the magnetic element 120, which in turn facilitates a reduction in center-to-center spacing of the conductors when multiple components 100 are arranged in an array such as in a solar string monitor application.

While the component 100 shown in the Figures is configured as an open loop current sensor, it may alternatively be configured as a closed loop current sensor. In a closed loop configuration, the magnetic element is provided with a secondary coil (not shown). A feedback current may be output to the secondary coil to generate a magnetic field in the opposite direction of the field generated from the current being sensed to essentially cancel or zero out the flux generated by the current being sensed. Closed loop sensors are known to be more accurate across a variety of different operating conditions, but also are more expensive, to manufacture. On the other hand, open loop configurations such as that shown may be provided in a smaller package size and are operable with comparatively lower power requirements that are perhaps more compatible with battery powered circuits, including but not necessarily limited to battery-powered solar circuits of a photovoltaic power system.

Figure 4:
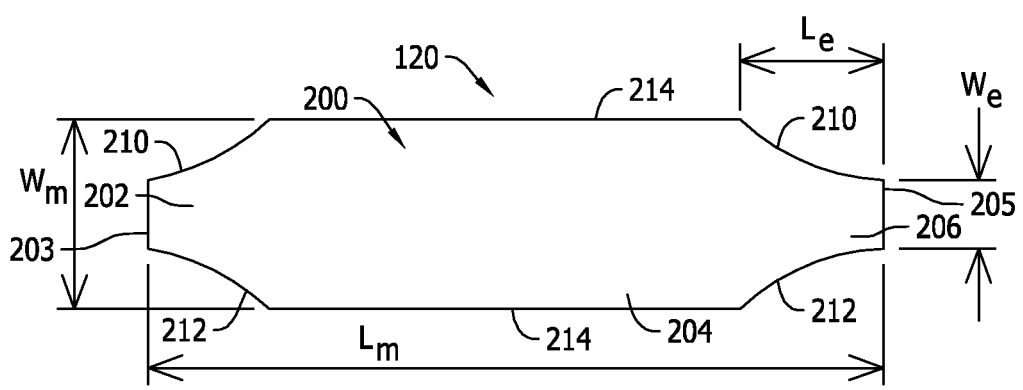
FIG. 4 is a top plan view of the magnetic core element for the assembly shown in FIGS. 1-3 at a first stage of manufacture.

FIG. 4 is a top plan view of the magnetic core element 120 at a first stage of manufacture. The core element 120 may be fabricated in one example from an unoriented, 80% nickel molybdenum alloy such as Carpenter HyMu80 "80"® Alloy of CRS Holdings, Inc., a subsidiary of Carpenter Technology Corporation. Wyomissing Pa. (www.cartech.com). Such material is metallic and available in sheet form to simplify manufacturing processes as described below. Alternative metal and alloy materials may be utilized however, provided that they have sufficient magnetic properties for the component 100 in use.

FIG. 4 shows a flat core pattern 200 that has been stamped or punched from a single, thin planar sheet of material of a predefined thickness (e.g., about 1 mm) such as that described above for the magnetic core element 120. Multiple core patterns 200 can be stamped or punched from a larger, prefabricated sheet of magnetic material to simplify bulk manufacturing processes, although in some embodiments it may be possible to form the core pattern 200 as a planar element directly into the desired shape of sheet material if desired. Different thicknesses of sheet material can be utilized to provide different thicknesses of the core pattern 200 in various embodiments. Fabricating the magnetic core element 120 from single sheets of material having a predetermined thickness advantageously simplifies the manufacture of the core element 120, and is specifically contrasted with laminated core elements involving more than one sheet and compressed powder core constructions that are known and utilized in conventional components.

The exemplary core pattern 200 as shown includes a first end section 202, a main section 204 and a second end section 206. The main section 204 is rectangular with parallel side edges. While the end sections 202 and 206 are tapered and extend as mirror images of one another on the opposing ends of the main section 204. The core pattern 200, by virtue of the sheet material from which it is formed, has a constant thickness throughout the first end section 202, the main section 204 and the second end section 206.

In the example shown, the flat core pattern 200 has an overall overall axial length $L_m$ of about 46.1 mm from a distal end 203 of the end section 202 to a distal end 205 of the end section 206. Each end section 202, 206 has an axial length $L_e$ of about 9.05 mm in the example shown and a width $W_e$ of about 4 mm at the distal ends 203, 205. The main section 204 has a width $W_m$ of about 12 mm in the example shown and as such is more than ten times the thickness of the core pattern 200. The width $W_m$ of the main section is much larger than the thickness of the core pattern (e.g., about 1 mm).

Each end section 202, 206 has variable width, tapered side edges 210, 212 having a radius of curvature of about 15.50 mm as shown that transitions from the width $W_e$ of the respective distal ends 203, 205 to the width $W_m$ of the main section 204. In between the end sections 202, 206, the main section 204 has straight and parallel opposing side edges 214 and has a constant width rather than being tapered. The distal ends 203, 205 of the end sections 202, 206 are substantially centered between the side edges 214 of the main section 204 (i.e., about 4 mm from each of the opposed side edges 214 in the width dimension).

The shape and dimensions shown and described for the core pattern 200 are exemplary only. Other shapes and dimensions may alternatively be used in further and/or alternative embodiments of the invention, paying appropriate attention to the magnetic flux considerations of the current being sensed in the examples described and the concentration of the magnetic flux so that the Hall element 130 or other type of sensor may detect the same. In other words, the sensitivity of the sensor utilized should be a consideration for deciding the dimensions of the core element 120 needed, with the dimensions providing an adequate magnetic response for the sensor to reliably operate.

In contemplated embodiments, a thickness of the single thin sheet of magnetic material used to fabricate the core pattern 200 may be within the range of about 0.3 mm to about 3.0 mm while still providing overall reduced size of the component assembly 100 and adequate performance in use. More specifically, a thickness of the single thin sheet of magnetic material used to fabricate the core pattern 200 may have a thickness less than about 2.0 mm in further embodiments. Beneficially, the single thin sheet of magnetic material used to fabricate the core pattern 200 has a thickness of about 1 mm.

Figure 5:
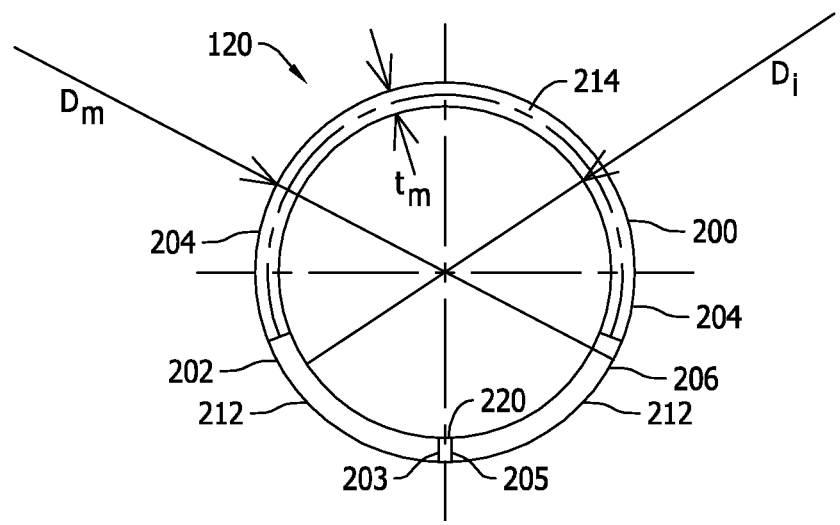
FIG. 5 is an end view of the magnetic core element shown in FIGS. 1-3 at a second stage of manufacture.
Figure 6:
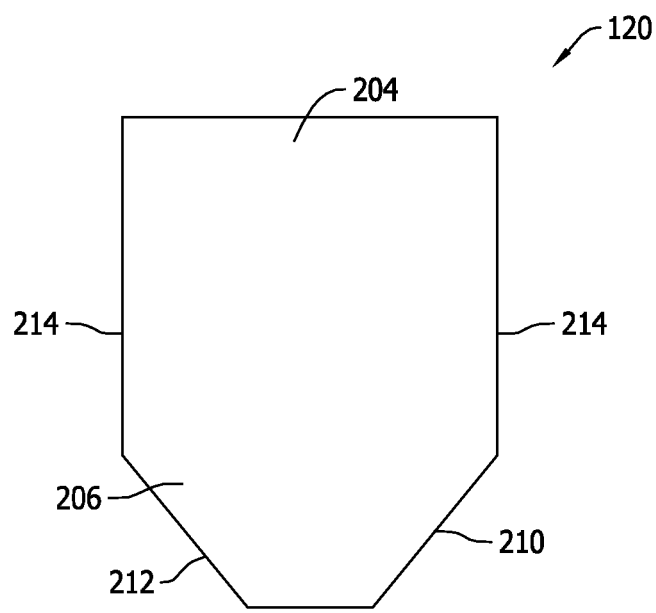
FIG. 6 is a side elevational view of the magnetic core shown in FIG. 5.

FIG. 5 is an end view of the magnetic core element 120 shown and FIG. 6 is a side elevational view of the magnetic core element 120 at a second stage of manufacture. In the second stage, the core pattern 200 is shaped into a cylinder. The axial length $L_m$ (FIG. 4) of the core pattern 200 is bent out of its flat and planar configuration as shown in FIG. 5 into a three dimensional ring or cylinder having the inner and outer diameter $D_i$ and $D_m$ discussed above. The thickness $t_m$ of the core pattern 200 is about 1 mm in the example shown, and is equal to the predetermined thickness of sheet material used to fabricate the core pattern 200. In contemplated embodiments, the ratio of the inner diameter $D_i$ to the thickness $t_m$ is greater than or equal to about 10:1. In other words, and to achieve the beneficial size reduction of the completed component 100 as described, the ratio of the inner diameter $D_i$ to the thickness $t_m$ of the magnetic core element 120 is at least about 10:1. Various other configurations are possible, however, and may be utilized.

The end section 202, the main section 204 and the end section 206 are shaped to have a continuous curvature as shown in FIGS. 5 and 6, and the distal ends 203, 205 of the core pattern 200 are spaced from one another to provide a gap 220 in the core element 120. The gap 220 is initially formed smaller than desired in the final component 100.

Figure 7:
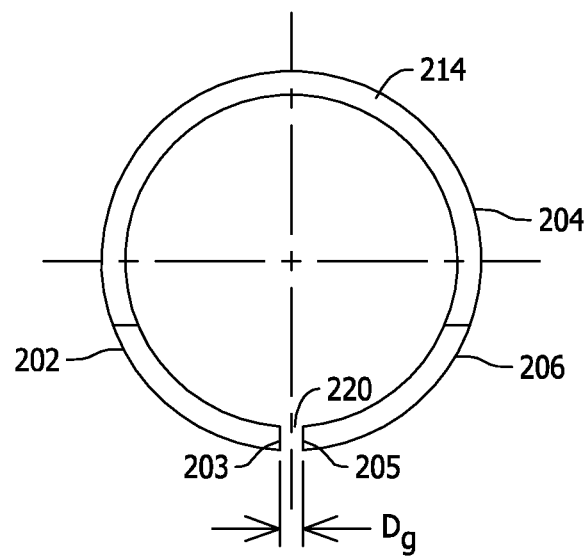
FIG. 7 is an end view of the magnetic core element shown in FIGS. 1-3 at a third stage of manufacture.
Figure 8:
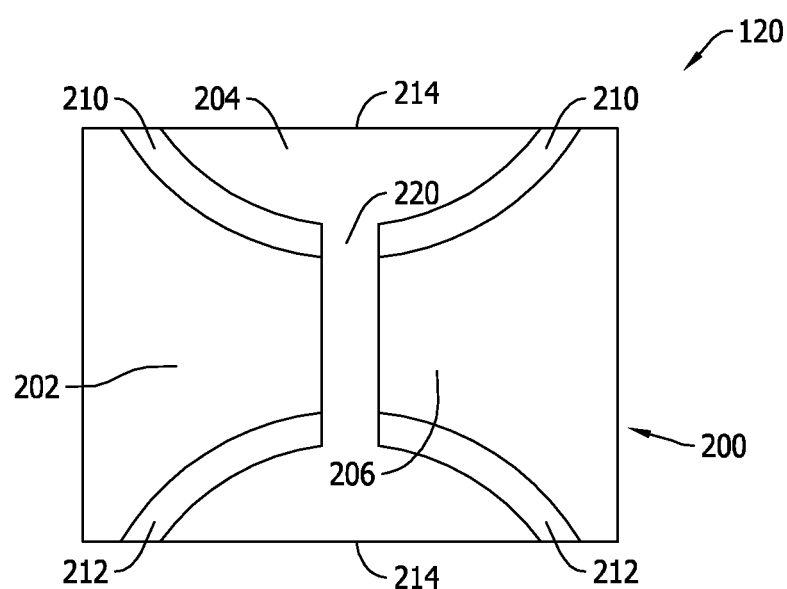
FIG. 8 is a bottom view of the magnetic core shown in FIG. 7.

FIG. 7 is an end view and FIG. 8 is a bottom view of the magnetic core element 120 shown in FIG. 5 at a third stage of manufacture. In the third stage, the shaped core pattern 200, after being shaped in the second stage as shown in FIGS. 5 and 6, is machined to form the final gap 220 of the desired size. In the example shown, the gap 220 has final dimension $D_g$ of about 1.65 mm. The dimension $D_g$ is about the same size as the corresponding dimension of the Hall element 130. The gap 200 further is located in the smallest width of the core element 120 between the tapered distal ends 203, 205 of the core pattern 200. The width dimension of the gap also roughly corresponds to the respective width dimension of the Hall element 130, such that the Hall element 130 substantially occupies the gap 220 when it is assembled therewith.

While exemplary dimensions for the magnetic core element 102 have been disclosed, other dimensions greater and smaller are possible in other embodiments and may be utilized. Likewise, while a true or right cylinder having a constant, circular cross section is shown and described for ease of manufacture, the core element 120 may be formed into other cylindrical shapes if desired, including but not limited to a cylinder having an oval-shaped or elliptical-shaped cross section, or as a further example a cylindrical shapes having at least one flat surface in combination with a curved surface such as a semi-cylindrical shape having a 180° curved section and a flat section extending between the 180° curved section. The gap may be formed in the flat section or the curved section in such an embodiment.

Figure 9:
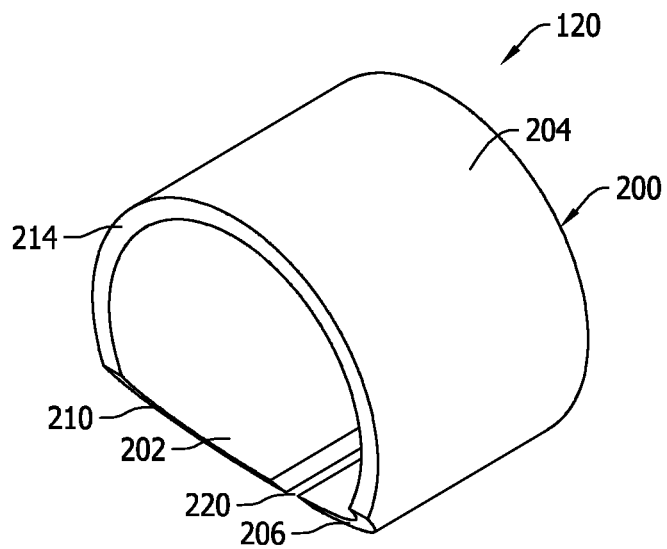
FIG. 9 is a perspective view of the magnetic core shown in FIG. 7.

FIG. 9 is a top view of the completed magnetic core element 120. The core element 120 is now ready for assembly into the component 100 (FIG. 1-3). The Hall element 130 may be installed to the gap 220 and may be connected to the circuit board 140 and collectively assembled in the housing 202 to complete the component as shown in FIG. 10.

Contrary to belief in the art that reduction in size of magnetic cores is detrimental from a performance perspective and/or that the manufacture of smaller sized core elements is difficult to reliably accomplish, the magnetic sheet material can be shaped into a thin walled cylinder core element 120 using relatively low cost and straightforward manufacturing techniques and still provide the sensitivity needed for a Hall sensor to provide reasonable voltage swings over practical and desirable current measuring ranges. Using magnetic sheet material and basic cutting, stamping, and shaping techniques, substantial reduction in core element thickness, and associated reduction in size of the component assembly 100 is easily accomplished without resort to more complicated and expensive manufacturing techniques.

Figure 11:
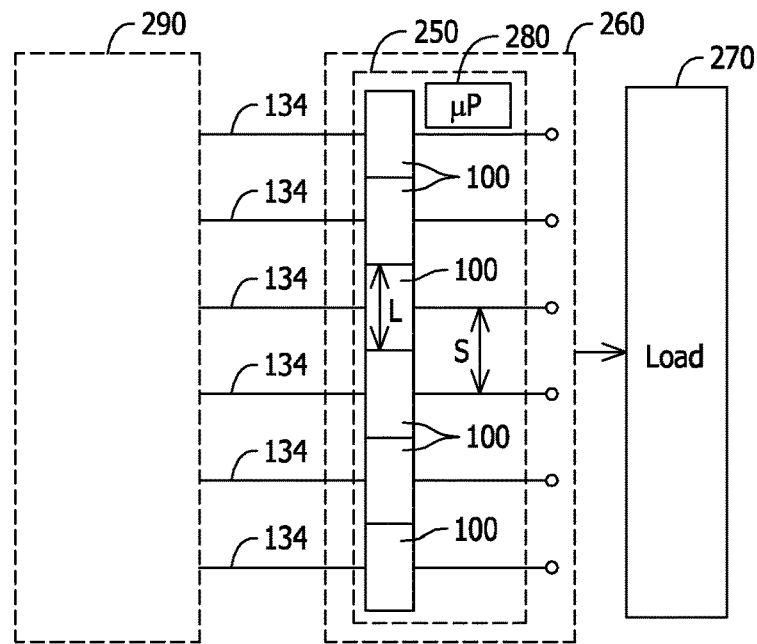
FIG. 11 schematically illustrates a photovoltaic power system including a current string monitor having a plurality of component assemblies as shown in FIG. 10.

FIG. 11 schematically illustrates a plurality of components 100 utilized in combination with a reduced center-center-spacing S between each of a plurality of conductors 134 passing through the components 100 via the passageways 132 described. Because of the thin-walled magnetic core element 120 that facilitates a reduction in length L of the components 100, the center-center-spacing S is reduced compared to existing components having larger core thickness. When a number n of components 100 are arranged side-by-side as shown, a number of conductors n may be monitored in a reduced amount of space than is otherwise possible using conventional components.

The n components may be arranged side-by-side in a one dimensional array as shown inside a multiple string monitor 250 (shown in phantom in FIG. 11). Because of the reduced size of the components 100 as described, the dimensions of the string monitor 250 may be desirably reduced. In contemplated embodiments the number n of components 100 in the string monitor 250 may be as few as two and as many as twelve, although even greater numbers n of components 100 in the string monitor 250 are possible.

The string monitor 250 may be included in a larger combiner box 260 (shown in phantom in FIG. 11). The combiner box 260, as those familiar with photovoltaic power systems would understand, connects the various conductors 134 present in series and provides a combined output to a load 270. While a single load 270 is shown, it is understood that the load 270 may represent more than one load in any implementation of an electrical power system. The strong monitor 250 and/or the combiner box 260 may include one or more processor based control elements 280 that intelligently analyze current flow through the conductors 134 that in contemplated embodiments may correspond to strings of a photovoltaic power generator system 290 that convert solar radiation energy to DC electrical power using well known techniques. The combiner box 260 and/or the string monitor 250 may be utilized to intelligently assess performance of the photovoltaic system via monitoring of the string conductors 134, as well as intelligently coordinate power distribution aspects and output from the combiner box 270.

The combiner box 260, like the string monitor 250, can be reduced in size because the center-to-center spacing of the conductors 134 has been reduced via the reduction in the size of the components 100 utilized.

The size reduction and benefits of the string monitor 250 and the combiner box 260 are more consequential in larger electrical power systems having high numbers of string conductors 134 and more than one combiner box 260. Also, more than one string monitor 250 may be included in a combiner box. Numerous variations are possible in this regard.

While the photovoltaic string monitor application is beneficial for the reasons stated, the string monitor 250 may be used for other purposes in an electrical power system. AC and DC power systems may benefit from the size reduction opportunities presented by the unique construction of the components 100.

The components 100 may also be used stand-alone components apart from their combination in a device such as a string monitor if desired.

Figure 12:
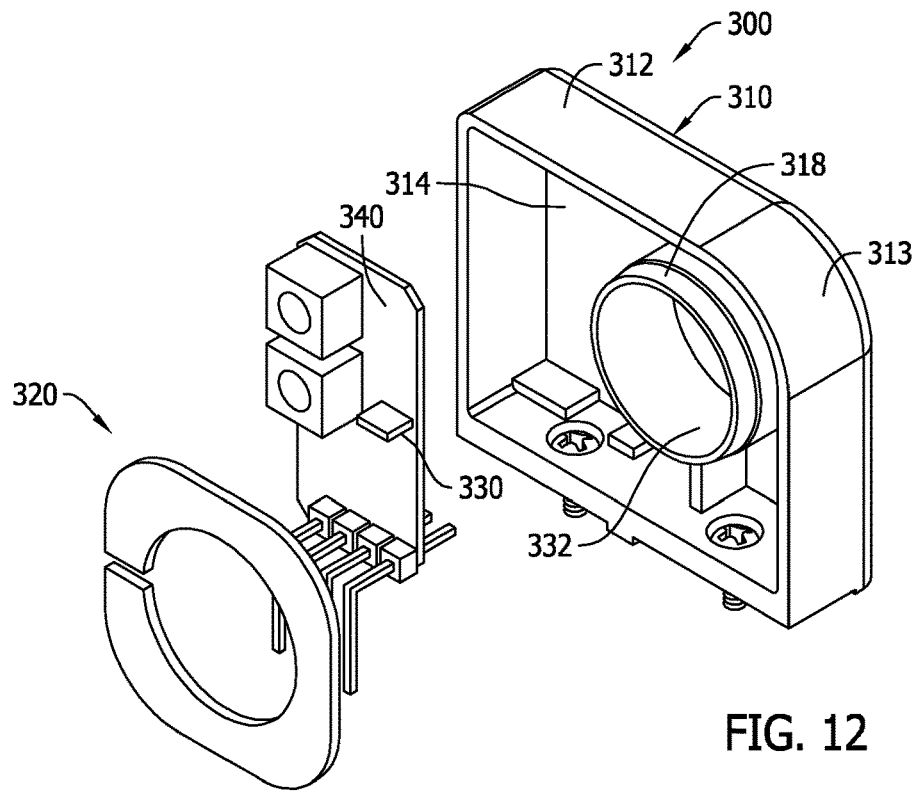
FIG. 12 is an assembly view of a magnetic component assembly according to a second exemplary embodiment of the present invention.

FIG. 12 is an assembly view of a magnetic component assembly 300 according to a second exemplary embodiment of the present invention. FIGS. 13 through 16 illustrate the component parts and their assembly shown in FIG. 12 in further detail as described below.

Like the assembly 100, the assembly 300 may be provided as a stand-alone component or in combination with other component assemblies for example, in a string monitor application or a combiner box application to simultaneously monitor a number of string conductors 134 (FIG. 11) in, for example, a photovoltaic electrical power system. The magnetic component assembly 300 may further be used in lieu of or in combination with the component assembly 100 as desired while realizing similar benefits.

Like the magnetic component assembly 100, the magnetic component assembly 300 generally includes a housing or enclosure 310, a thin-walled magnetic core element 320, a Hall sensor element 330 installed in a gap of the core element 320, and a Hall sensor printed circuit board 340.

Figure 13:
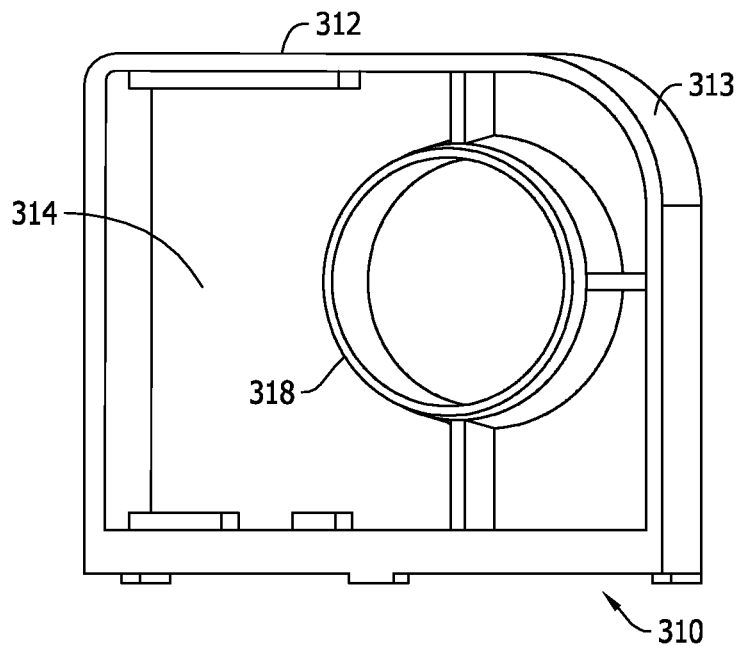
FIG. 13 is a perspective view of a portion of housing for the assembly shown in FIG. 12.
Figure 16:
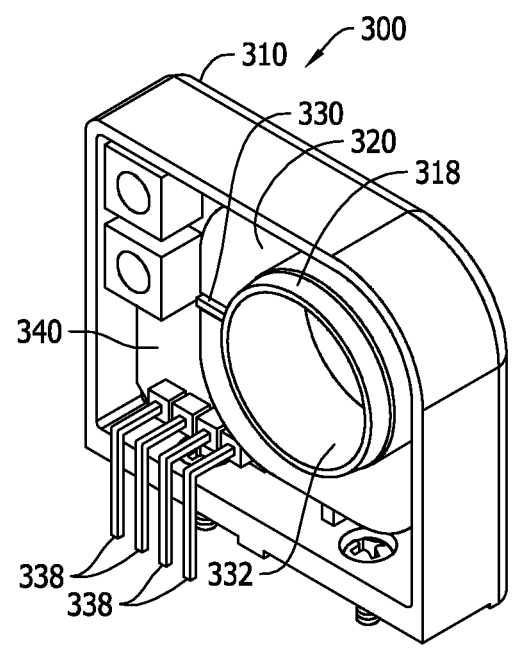
FIG. 16 is a front perspective assembled view of the assembly shown in FIG. 12.

The housing 310 in the example shown in FIGS. 12 and 13 is fabricated from an electrically nonconductive material such as plastic according to known techniques such as molding, and in the example shown includes a generally rectangular outer wall 312 defined by generally orthogonal side walls and one rounded corner 313, a rear wall 314, and an inner wall 318. The outer wall 312, the inner wall 318 and the rear wall 314 define a space or receptacle therebetween that receives the magnetic core element 320 as best seen in FIG. 16.

The inner wall 318 is generally cylindrical and completes a circumferential surface extending 360° about a center point to define an interior, cylindrical opening or passageway 332 from the front of the housing 310 to the opposing rear wall 314. In the exemplary embodiment shown in FIGS. 12-16, the interior surface of the inner wall 318 has an outer diameter $D_p$ of about 16 mm. The exterior circumferential surface of the inner wall 318 includes a stepped peripheral surface having first cylindrical surface with a relatively smaller outer diameter facing the open end of the housing 310 and a relative larger cylindrical surface having a relatively larger outer diameter extending to the rear wall 314. The outer diameter of the relatively larger cylindrical surface may be, for example, about 18 mm. Other relative dimensions are, of course, possible in other embodiments. In any event, the passageway 332 may receive an electrical conductor similar to the conductor 134 shown in phantom in FIG. 3 such as a wire conductor or conductor cable therethrough. When the conductor 134 is passed through the passageway 332 and when electrical current flows through the conductor 134, a magnetic field is generated that may be measured with the Hall element 330 and the Hall sensor printed circuit board 340.

The Hall element 330 may be a commercially available Hall element such as an SS490 Series Miniature Ratiometric Liner Hall Effect element available from Honeywell Inc. of Freeport Ill. Other Hall elements are known, however, and may be utilized. When installed to circuit board 340 and the core element 320 and to the housing 310, output pins 338 (best seen in FIG. 16) extend perpendicularly to the axis of the passageway 332 through which the conductor 134 is extended. The output pins 338 are, in turn, received in through holes on a circuit board 400 (FIGS. 17 and 18) to establish electrical connection therewith. In other embodiments, other types of sensors may be utilized in combination with the magnetic core element 320 to detect a parameter of interest, including but not limited to electrical current flow through the conductor 134.

The Hall sensor printed circuit board 340 includes an amplifier and circuitry to effect the measurement of the current that generates the magnetic field detected by the Hall element 330. Suitable circuitry for the board 340 is commonly known and available. As the construction and operation of the circuitry is well-known and understood, further discussion thereof is not believed to be necessary. While in the embodiment described, the circuit board 340 is configured to implement a Hell effect current sensor, other configurations are possible and may likewise be utilized in the component assembly 100.

The front side of the housing 310, opposing the rear wall 314, is open and unobstructed to facilitate the assembly of the component 300 as illustrated in the perspective view of FIG. 12, and in assembled view of FIG. 16. A nonconductive cover piece (now shown) may optionally be provided on the open front if desired. In some cases, if the component assembly 300 is located inside a protective housing of another device, such as a string monitor or combiner box, no such cover piece may be necessary.

The exemplary component assembly 300, in comparison to the exemplary component 100 described above having a length dimension L of about 25 mm, the assembly 300 has a corresponding length dimension L of about 39.2 mm. The increased length dimension of the component assembly 300 is, at least in part, because the circuit board 340 is located to the side of the passageway 332 rather than beneath as in the component assembly 100. Also, while the passageway 132 in the component assembly 100 is generally centered on the length dimension of the assembly 100, the passageway 332 in the device is not. In the exemplary component assembly 300, the center of the passageway 332, measured along the length dimensions, is located about 24.6 mm from the vertically extending left side of the housing 310 in FIGS. 12 and 16. Alternatively, in the example shown the center of the passageway 332, measured along the length dimensions, is located about 14.6 mm from the vertically extending right side of the housing 310 in FIGS. 12 and 16 that includes the rounded corner. Despite the increased length dimension of the assembly 300, a more compact center-to-center spacing of conductors may nonetheless be realized when multiple component assemblies 300 are utilized in combination as further described below.

In comparison to the exemplary component assembly 100 shown in FIGS. 1-3 having height dimension H of about 39 mm, the exemplary component assembly 300 has a height dimension of about 34.1 mm. The reduced height dimension of the component assembly 300 is, in part, because the circuit board 340 is located to the side of the passageway 332 rather than beneath as in the component assembly 100. In the example shown, the vertical center of the passageway 332 is positioned about 19.5 mm from the bottom side of the housing 310 from which the connector pins 338 (FIG. 16) extend. As such, the passageway 332 is positioned closer to the top side of the housing 310 than the bottom side.

In comparison to the component assembly 100 shown in FIGS. 1-3 having an exemplary width dimension W of about 13 mm, the component assembly 300 has a corresponding width dimension of about 11 mm. The width dimension (about 11 mm) of the component assembly 300 in this example is less than the diameter $D_p$ (about 15.9 mm) of the passageway 332, less than a third of the length dimension L (about 39.2 mm), and about a third of the height dimension H (about 34.1 mm in this example). Other proportions of length, width, height, and passageway dimensions are possible and may be utilized in other embodiments.

The circuit board 340 in the assembly 300 is also seen to extend generally vertically in the component assembly 300 as shown in FIGS. 12 and 16, while in the assembly 100 the circuit board 140 is shown to extend horizontally in the Figures of 1-3. Alternatively stated, the major plane of the circuit board 340 in the assembly 300 extends parallel to the height dimension of the device and perpendicular to its length dimension, while the plane of the circuit board 140 in the assembly 100 extends parallel to the length dimension and perpendicular to the height dimension of the device. That is, the orientation of the circuit board 340 in the assembly 300 is perpendicular to the orientation of the circuit board 140 in the assembly 100. In the assembly 100, the circuit board 140 extends perpendicular to the rear wall 114 of the housing 110, whereas in the assembly 300 the circuit board 340 extends parallel to the rear wall 314 of the housing 310.

Figure 14:
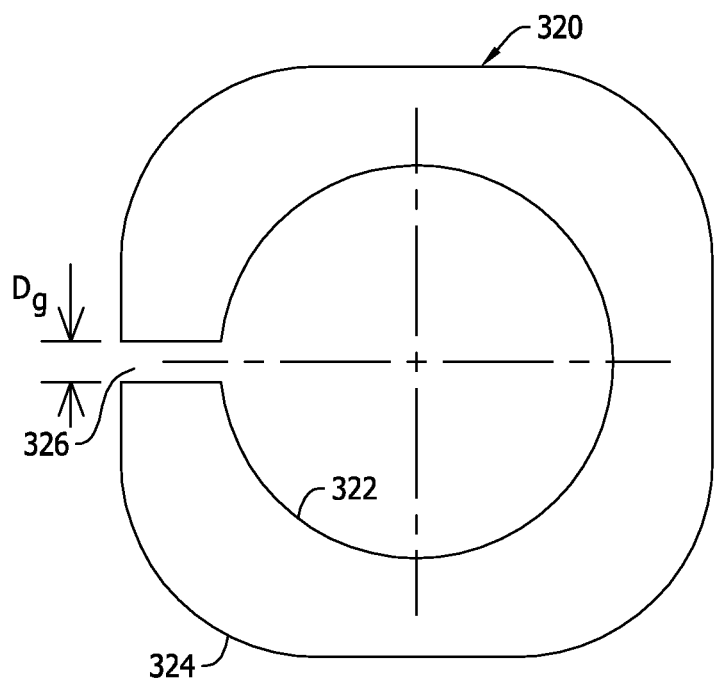
FIG. 14 is a top plan view of the magnetic core element for the assembly shown in FIG. 12.
Figure 15:
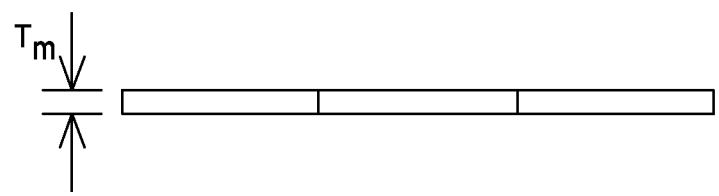
FIG. 15 is an end view of the magnetic core element shown in FIG. 14.

The thin-walled magnetic core element 320 as seen in FIGS. 12, 14 and 15 is generally a generally flat and planar element, whereas the core element 120 in the assembly 300 is a three dimensional element. The planar core element 320 includes a round, circumferential inner surface 322 defining a nearly 360° loop about a center point thereof and an outer circumference or periphery 324 that is partly round and partly flat. A gap 326 is integrally formed in the planar core element 320 and is dimensioned to accommodate the sensor 330 (FIG. 12). The gap has a dimension $D_g$ of about 1.6 mm in the example shown, and is sufficient to accommodate the sensor 330 as shown in FIGS. 12 and 16. The dimension $D_g$ is about the same size as the corresponding dimension of the Hall element 330. The gap 326 in the example shown is centered on one of the side edges of the core element 120 and is located in the smallest width section of the core element 320 between the rounded corners on opposing sides of the gap 326. The width dimension of the gap 326 also roughly corresponds to the respective width dimension of the Hall element 330, such that the Hall element 330 substantially occupies the gap 326 when it is assembled therewith.

The magnetic core element 320 may be fabricated from a suitable magnetic material known in the art according to known manufacturing techniques. In contemplated embodiments, for example, the magnetic core element 320 may be fabricated from nickel-iron alloys such as MU metal or Permalloy. Known lamination techniques, for example, may be used to fabricate a planar sheet of magnetic material of the desired thickness, and the sheet material may be laser cut into the shape as shown. Multiple core elements 320 can be stamped or punched from a larger, prefabricated sheet of magnetic material to simplify bulk manufacturing processes, although in some embodiments it may be possible to form the core element 320 as a planar element directly into the desired shape of sheet material if desired. While specific techniques are mentioned above to fabricate the core element 320, other techniques may be utilized to form and provide the magnetic core element(s) 320 if desired. Different thicknesses of sheet material can be utilized to provide different thicknesses of the core element 320 in various embodiments. Fabricating the magnetic core element 320 from a single sheet of material having a predetermined thickness advantageously simplifies the manufacture of the core element 320.

The inner surface 322 of the core element 320 has a diameter of about 18.1 mm in one example, and is slightly larger than the outer diameter of the inner wall 318 of the housing 312. The core element 320 has an outer periphery or circumference 324 that is partly flat and partly round. That is the outer periphery or circumference 324 includes generally orthogonal straight side edges with rounded corners. The straight side edges of the outer periphery or circumference 324 have an equal length in the example shown, imparting a generally square shape to the core element on the outer periphery 324 in between the rounded corners. The top and bottom and left and right edges of the core element 320 shown in FIG. 14 are respectively spaced apart by a distance of about 27.1 mm in the example shown.

Referring to FIG. 15, the planar magnetic core element 120 has a thickness $t_m$ of only about 1 mm that is substantially less than conventional cores used in otherwise similar components. The planar core element 320, by virtue of the sheet material from which it is formed, has a constant thickness throughout as can clearly be seen in FIG. 13.

The shape and dimensions shown and described for the core element 320 are exemplary only. Other shapes and dimensions may alternatively be used in further and/or alternative embodiments of the invention, paying appropriate attention to the magnetic flux considerations of the current being sensed in the examples described and the concentration of the magnetic flux so that the Hall element 330 or other type of sensor may detect the same. In other words, the sensitivity of the sensor utilized should be a consideration for deciding the dimensions of the core element 320 needed, with the dimensions providing an adequate magnetic response for the sensor to reliably operate.

In contemplated embodiments, a thickness of the single thin sheet of magnetic material used to fabricate the core element 320 may be within the range of about 0.3 mm to about 3.0 mm while still providing an overall compact size of the component assembly 100 and adequate performance in use. More specifically, a thickness of the single thin sheet of magnetic material used to fabricate the core element 320 may have a thickness less than about 2.0 mm in further embodiments. Beneficially, the single thin sheet of magnetic material used to fabricate the core pattern 200 has a thickness of about 1 mm. Unlike the core element 120, the core element 220 is planar element before and after formation. In other words, no portion of the core element 320 is bent out of the plane of the sheet material from which the element 320 is formed. The manufacture of the core element 320 is therefore simpler than the manufacture of the core element 120.

Once formed into the desired shape, the magnetic core element 320 is ready for assembly into the component 300 (FIGS. 12 and 16). The Hall element 330 (which may be pre-installed to the circuit board 340) may be installed to the housing 310 in the receptacle alongside the passageway 332. The core element 320 may be inserted over the inner wall 118 of the housing 310 with the gap 326 receiving the Hall element 330 as shown in FIGS. 12 and 16 to complete the component assembly 300. When assembled, the major plane of the magnetic core element 320 extends generally parallel to the major plane of the circuit board 340, which in turn extends parallel to the major plane of the rear wall 314 of the housing 310. This arrangement of stacked, planar elements provides a compact device while offering magnetic performance that is has heretofore been difficult to achieve using devices of similar size, or alternatively to accomplish a size reduction for the resultant device that has heretofore been considered impractical or impossible to reliably and economically manufacture.

While the component 300 shown in FIGS. 12 and 16 is configured as an open loop current sensor, it may alternatively be configured as a closed loop current sensor. In a closed loop configuration, the magnetic element is provided with a secondary coil (not shown). A feedback current may be output to the secondary coil to generate a magnetic field in the opposite direction of the field generated from the current being sensed to essentially cancel or zero out the flux generated by the current being sensed. Closed loop sensors are known to be more accurate across a variety of different operating conditions, but also are more expensive, to manufacture. On the other hand, open loop configurations such as that shown may be provided in a smaller package size and are operable with comparatively lower power requirements that are perhaps more compatible with battery powered circuits, including but not necessarily limited to battery-powered solar circuits of a photovoltaic power system.

Figure 17:
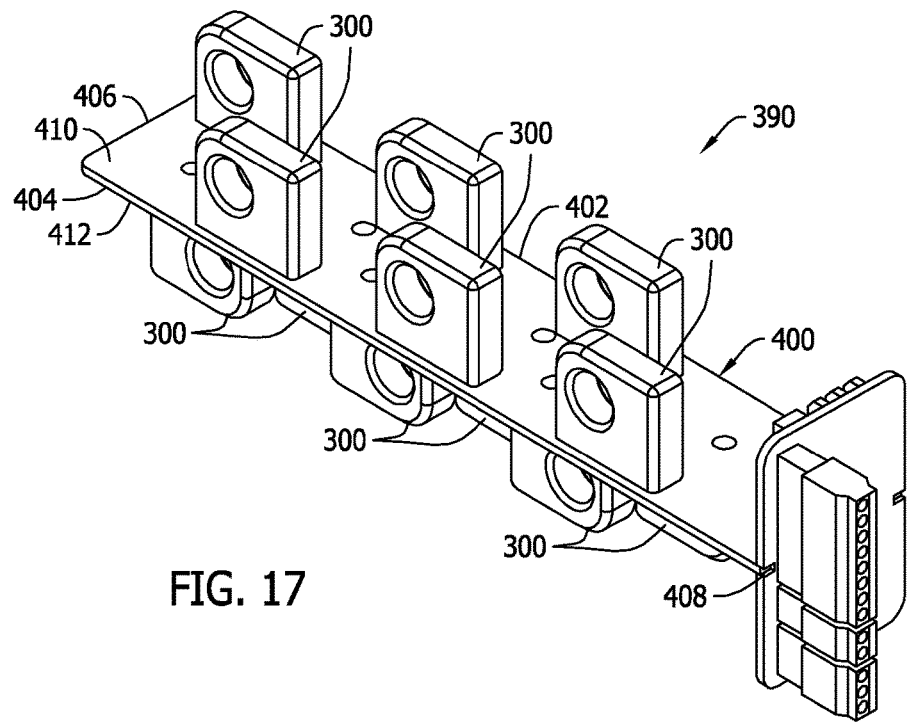
FIG. 17 is a perspective view of a circuit board assembly including a plurality of magnetic component assemblies shown in FIGS. 12-16.
Figure 18:
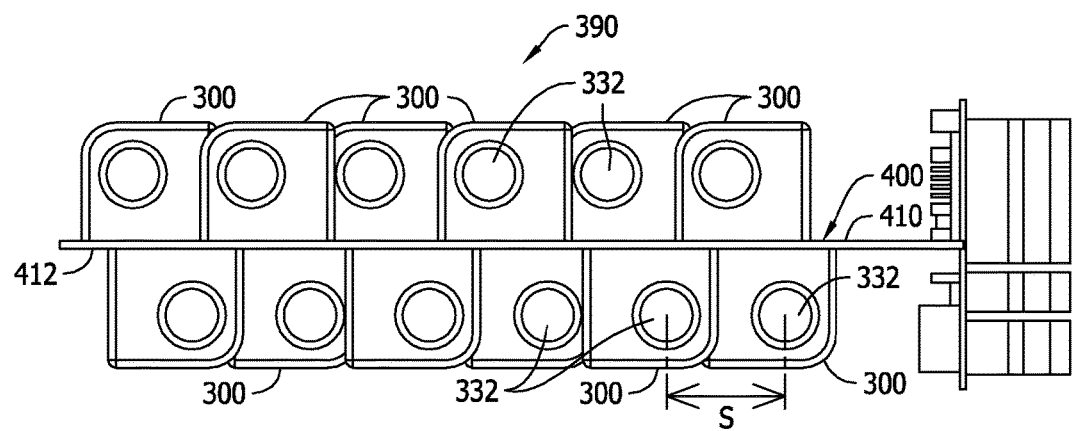
FIG. 18 is a front elevational view of the assembly shown in FIG. 17.

FIGS. 17 and 18 illustrate an exemplary circuit board assembly 390 including a circuit board 400 and a plurality of component assemblies 300 utilized in combination on the board 400 with a reduced center-center-spacing S between the respective passageways 332 described. The circuit board 400 in the example shown is generally elongated with opposed longitudinal sides 402, 404 and opposed lateral sides 406, 408 interconnecting the longitudinal sides 402, 404. The circuit board 400 further has a first flat and planar major side surface 410 and a second flat and planar major side surface 412 opposing the first surface 410 and extending in a respectively spaced apart, but parallel plane from the first major side surface 410.

Also in the example shown, six component assemblies 300 are respectively mounted to each of the side surfaces 410, 412 of the circuit board 400. On the first side 410, two rows of component assemblies 300 are installed via the pin connectors 338 (FIG. 16) and complementary through holes in the circuit board 400. As shown in FIG. 17, each row includes three component assemblies 300 that are respectively spaced apart from one another by a distance about equal to the length dimension L of each component assembly 300. Further, each row of component assemblies 300 is staggered or offset relative to one another. In combination, the staggering of each rows and the space between component assemblies 300 in each row, as shown in plan view in FIG. 18, effectively provides an array of side-by-side component assemblies on the first side 410 for conductors to pass with a reduced center-to-spacing of the conductors.

Likewise, on the second side 412 of the circuit board 400, two rows of component assemblies 300 are installed via the pin connectors 338 (FIG. 16) and complementary through holes in the circuit board 400. As shown in FIG. 17, each row includes three component assemblies 300 that are respectively spaced apart from one another by a distance about equal to the length dimension L of each component assembly 300. Further, each row of component assemblies 300 is staggered or offset relative to one another. In combination, the staggering of each rows and the space between component assemblies 300 in each row, as shown in plan view in FIG. 18, effectively provides an array of side-by-side component assemblies on the second side 412 of the circuit board 400 for conductors to pass with a reduced center-to-spacing of the conductors.

Moreover, and as seen in FIG. 18, the passageways 332 of the component assemblies 300 on the first side 410 of the circuit board 400 are staggered or offset from the passageways 332 of the component assemblies 300 on the second side 410 of the circuit board 400. As such, the passageways 332 of the component assemblies 300 on the first side 410 are positioned substantially between the passageways 332 of the component assemblies 300 on the second side 412. In the example shown, the center-to-center spacing of the passageways 332 on the first and second sides 410, 412 is the same, but because of the staggering of the passageways 332 on each side 410, 412, the center-to-center spacing of the conductors passing through the passageways 332 on each side 410, 412 can be decreased by 50%. In other words, in one contemplated embodiment, the center-to-center spacing of the passageways 332 on each side 410, 412 of the board 400 is about 35 mm, but because of the staggered component assemblies 300 on the sides 410, 412 a conductor passing through a passageway 332 on the first side 410 will have a center-to-center spacing, measured in a direction parallel to the planes of the sides 410, 412, of about 17.5 mm from an adjacent conductor passing through a passageway on the second side 412. As such, even though the component assemblies 300 are larger in the length dimension L than the assemblies 100, when used in the arrangement shown a smaller center-to-center spacing may result than if the component assemblies 100 were utilized in another arrangement.

It is recognized, however, that if the component assemblies 100 were utilized in a similar arrangement to that shown in FIGS. 17 and 18, a reduced center-to-spacing may be possible because the component assemblies 100 have a smaller length dimension. In a string monitor or combiner box application for an electrical power system such as those described above, the operating voltage of the electrical system will generally require some minimum amount of center-to-center spacing that will vary from application to application. Nonetheless, a relative reduction of center-to-center spacing provided by the circuit board assembly 300 facilitates a reduction in size of the associated string monitor or combiner box.

While six component assemblies 300 are shown on each side 410, 412 of the board 400 (i.e., twelve component assemblies total), any number n of components 300 (both greater and smaller) may alternatively be utilized. Consequently, any a number of conductors n may be monitored in a reduced amount of space than is otherwise possible using conventional, and larger, magnetic component assemblies. In specific contemplated embodiments the number n of components 100 in the circuit board assembly 390 may be as few as two and as many as twelve, although even greater numbers n of component assemblies 300 in the circuit board assembly 390 are possible. As further variations, each side 410, 412 of the board 400 may include different numbers of component assemblies 300 or 100, and the component assemblies 300 and 100 may be used in combination in the circuit board assembly 390 on the same or different ones of the sides 410, 412. Also, while one circuit board 400 is shown, more than one board can be provided including the same or different number (and type) of component assemblies 100 and 300.

In contemplated embodiments, the circuit board assembly 390 is configured as a string monitor. The circuitry on the board 400 allows for signal output to, for example, a processor based device using known connectors as shown in FIGS. 17 and 18. Conductors passing through the passageways 332 of the component assemblies may accordingly be simultaneously monitored by the respective component assemblies 300 and analyzed by a processor-based device on the board or a separately provided processor-based device in communication with the board 400.

The circuit board assembly 390, configured as a string monitor, may therefore correspond to the string monitor 250 (shown in phantom in FIG. 11). As previously mentioned, the string monitor 250 may be included in a larger combiner box 260 (also shown in phantom in FIG. 11). The combiner box 260, as those familiar with photovoltaic power systems would understand, connects the various conductors 134 present in series and provides a combined output to a load 270. While a single load 270 is shown, it is understood that the load 270 may represent more than one load in any implementation of an electrical power system. The strong monitor 250 and/or the combiner box 260 may include one or more processor based control elements 280 that intelligently analyze current flow through the conductors 134 that in contemplated embodiments may correspond to strings of a photovoltaic power generator system 290 that convert solar radiation energy to DC electrical power using well known techniques. The combiner box 260 and/or the string monitor 250 may be utilized to intelligently assess performance of the photovoltaic system via monitoring of the string conductors 134, as well as intelligently coordinate power distribution aspects and output from the combiner box 270.

The combiner box 260, like the string monitor 250, can be reduced in size because the center-to-center spacing of the conductors 134 has been reduced via the reduction in center-to-center spacing of the passageways 332 provided by the component assemblies 300 in the circuit board assembly 390.

As before, the size reduction and benefits of the string monitor 250 and the combiner box 260 are more consequential in larger electrical power systems having high numbers of string conductors 134 and more than one combiner box 260. Also, more than one string monitor 250 may be included in a combiner box. Numerous variations are possible in this regard.

While the photovoltaic string monitor application is beneficial for the reasons stated, the string monitor 250 may be used for other purposes in an electrical power system. AC and DC power systems may benefit from the size reduction opportunities presented by the unique construction of the components 100.

Like, the components 100, the components 300 may also be used stand-alone components apart from their combination in a device such as a string monitor if desired.

The benefits and advantages of the inventive concepts disclosed are now believed to have been amply illustrated in related to the exemplary embodiments described.

An embodiment of a magnetic component assembly has been disclosed including: a housing; and a magnetic core element assembled to the housing, the magnetic core element fabricated from a single, thin sheet of magnetic material; wherein the housing and the magnetic core element are each formed with a passageway configured to accept a conductor passed therethrough.

Optionally, a thickness of the single, thin sheet of magnetic material may be within a range of about 0.3 mm to about 3.0 mm. The single, thin sheet of magnetic material may also have a thickness less than about 2.0 mm. The single, thin sheet of magnetic material may also have a thickness of about 1 mm. The single, thin sheet magnetic material may include an unoriented, 80% nickel molybdenum alloy. The magnetic core element may be assembled to the housing in a planar configuration, or may be assembled to the housing in a three-dimensional configuration. The magnetic core element may have a thickness and an inner diameter, wherein the ratio of the inner diameter to the thickness at least about 10:1.

The magnetic component assembly may also include a current sensor placed in proximity to the magnetic core element. The current sensor may be configured to generate voltage proportional to an amount of magnetic flux concentrated in magnetic core element in response to an amount of current flowing through the conductor when the conductor is passed through the passageway. The current sensor may be a Hall element. The magnetic core element may define a gap, and a Hall element may be received in the gap.

The magnetic component assembly may further include a circuit board in the housing and in spaced relation from the magnetic core element. The circuit board may be configured to measure a current flowing through the conductor. The housing may have a height dimension and a length dimension, and a major plane of the circuit board may extend parallel to the height dimension of the device and perpendicular to its length dimension. Alternatively, a major plane of the circuit board may extend parallel to the length dimension and perpendicular to the height.

The passageway may have a diameter of about 11.5 mm to about 18 mm. At least a portion of the magnetic core element may be cylindrical in shape. The cylindrical-shaped magnetic core element may have an outer radius of about 16 mm.

An outer periphery of the magnetic core element may also include at least one straight edge and at least one rounded edge. An inner periphery of the magnetic core element may be round.

The housing may include a rear wall and an inner wall projecting from the rear wall. The magnetic core element may be assembled to the inner wall. The housing may further include an intermediate wall projecting from the rear wall, and the magnetic core element may be received between the inner wall and the intermediate wall. The inner wall may be cylindrical and may define the passageway on an interior surface thereof. The inner wall may define a slot on an exterior surface thereof. The magnetic component assembly may include a Hall element, and a portion of the Hall element may extend in the slot. The intermediate wall may define an incomplete cylinder having first and second ends, wherein the slot is located between the first and second ends.

The magnetic core element may include a core pattern having tapered ends. The core pattern may be shaped into a cylinder, and a gap may be defined between the tapered ends.

The component may be configured as a non-contact current sensor, and may be configured as an open loop Hall effect current sensor. The housing may be assembled in one of a string monitor and a combiner box.

An embodiment of a magnetic component assembly is disclosed including: a magnetic core element fabricated from a flat core pattern having a thickness of from about 0.3 mm to about 3.0 mm, the core pattern having opposing tapered ends and being shaped into a cylinder including a gap defined between the opposing tapered ends; wherein the cylinder includes an opening configured to accept a conductor passed therethrough.

Optionally, the single thin sheet of magnetic material has a thickness less than about 2.0 mm. The single thin sheet of magnetic material may also have a thickness of about 1 mm. The single thin sheet magnetic material may be an unoriented, 80% nickel molybdenum alloy.

A Hall element may be placed in the gap. The magnetic component assembly may further include a circuit board, wherein the circuit board is configured to measure a current flowing through the conductor. The magnetic component may include a housing having a height dimension and a length dimension, and a major plane of the circuit board extending perpendicular to the height dimension and perpendicular to the height dimension. The magnetic core element may have an inner diameter, and a ratio of the inner diameter to the thickness may be greater than or equal to 10:1. The cylinder may have an outer radius of about 16 mm. The magnetic core element may be assembled to the housing, and the housing may have a length of about 25 mm or less. The housing may also have a length of about 18 mm.

The housing may include a rear wall, an inner wall projecting from the rear wall, and an intermediate wall projecting from the rear wall, and wherein the magnetic core element is received between the inner wall and the intermediate wall. The component may be configured as a non-contact current sensor, and may be configured as an open loop Hall effect current sensor.

An embodiment of a magnetic component assembly has also been disclosed including: a housing formed with a passageway; and a planar magnetic core element assembled to the housing around the passageway, the planar magnetic core element having a thickness from about 0.3 mm to about 3 mm, the planar magnetic core element formed with an outer periphery and an inner periphery, and a gap extending from the outer periphery to the inner periphery.

The outer periphery may include at least one straight side and at least one rounded corner. The magnetic core element may have a thickness of about 1 mm. A Hall element may be placed in the gap. A circuit board may be assembled in the housing. The housing may include a rear wall and an inner wall projecting from the rear wall, with the magnetic core element assembled to the inner wall and a major plane of the circuit board extending parallel to the rear wall. The component may be configured as a non-contact current sensor, and may be configured as an open loop Hall effect current sensor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic component assembly comprising:
   a housing; and
   a magnetic core element assembled to the housing, the magnetic core element fabricated from a single, thin sheet of magnetic material;
   wherein the housing and the magnetic core element are each formed with a passageway configured to accept a conductor passed therethrough.

2. The magnetic component assembly wherein a thickness of the single, thin sheet of magnetic material is within a range of about 0.3 mm to about 3.0 mm.

3. The magnetic component assembly of claim 2, wherein the single, thin sheet of magnetic material has a thickness less than about 2.0 mm.

4. The magnetic component assembly of claim 3, wherein the single, thin sheet of magnetic material has a thickness of about 1 mm.

5. The magnetic component assembly of claim 1, wherein the single, thin sheet magnetic material comprises an unoriented, 80% nickel molybdenum alloy.

6. The magnetic component assembly of claim 1, wherein the magnetic core element is assembled to the housing in a planar configuration.

7. The magnetic component of claim 1, wherein the magnetic core element is assembled to the housing in a three-dimensional configuration.

8. The magnetic component assembly of claim 1, further comprising a current sensor placed in proximity to the magnetic core element.

9. The magnetic component assembly of claim 8, wherein the current sensor is configured to generate voltage proportional to an amount of magnetic flux concentrated in magnetic core element in response to an amount of current flowing through the conductor when the conductor is passed through the passageway.

10. The magnetic component assembly of claim 1, wherein the current sensor comprises a Hall element.

11. The magnetic component assembly of claim 1, wherein the magnetic core element has a thickness and an inner diameter, and wherein the ratio of the inner diameter to the thickness at least about 10:1.

12. The magnetic component assembly of claim 1, wherein magnetic core element defines a gap.

13. The current sensing assembly as claimed in claim 12, further comprising a Hall element received in the gap.

14. The magnetic component assembly of claim 1, further comprising a circuit board in the housing and in spaced relation from the magnetic core element.

15. The magnetic component assembly of claim 14, wherein the circuit board is configured to measure a current flowing through the conductor.

16. The magnetic component assembly of claim 14, wherein the housing has a height dimension and a length dimension, and wherein a major plane of the circuit board extends parallel to the height dimension of the device and perpendicular to its length dimension.

17. The magnetic component assembly of claim 14, wherein the housing has a height dimension and a length dimension, and wherein a major plane of the circuit board extends parallel to the length dimension and perpendicular to the height.

18. The magnetic component assembly of claim 1, wherein the passageway has a diameter of about 11.5 mm to about 18 mm.

19. The magnetic component assembly of claim 1, wherein at least a portion of the magnetic core element is cylindrical in shape.

20. The magnetic component assembly of claim 17 wherein the cylindrical-shaped magnetic core element has an outer radius of about 16 mm.

21. The magnetic component assembly of claim 1, wherein an outer periphery of the magnetic core element has at least one straight edge and at least one rounded edge.

22. The magnetic component assembly of claim 21, wherein an inner periphery of the magnetic core element is round.

23. The magnetic component assembly of claim 1, wherein the housing has a rear wall and an inner wall projecting from the rear wall.

24. The magnetic component assembly of claim 23, wherein the magnetic core element is assembled to the inner wall.

25. The magnetic component assembly of claim 23, wherein the housing further comprises an intermediate wall projecting from the rear wall, and wherein the magnetic core element is received between the inner wall and the intermediate wall.

26. The magnetic component assembly of claim 23, wherein the inner wall is cylindrical and defines the passageway on an interior surface thereof.

27. The magnetic component assembly of claim 23, wherein the inner wall defines a slot on an exterior surface thereof.

28. The magnetic component assembly of claim 27, further comprising a Hall element, and a portion of the Hall element extending in the slot.

29. The magnetic component assembly of claim 27, wherein the housing further comprises an intermediate wall, and wherein the intermediate wall defines an incomplete cylinder having first and second ends, wherein the slot is located between the first and second ends.

30. The magnetic component assembly of claim 1, wherein the magnetic core element comprises a core pattern having tapered ends.

31. The magnetic component assembly of claim 30, wherein the core pattern is shaped into a cylinder, and a wherein a gap is defined between the tapered ends.

32. The magnetic component assembly of claim 1, wherein the component is configured as a non-contact current sensor.

33. The magnetic component assembly of claim 32, wherein the component is configured as an open loop Hall effect current sensor.

34. The magnetic component assembly of claim 1, wherein the housing is assembled in one of a string monitor and a combiner box.

35. A magnetic component assembly comprising:
a magnetic core element fabricated from a flat core pattern having a thickness of from about 0.3 mm to about 3.0 mm, the core pattern having opposing tapered ends and being shaped into a cylinder including a gap defined between the opposing tapered ends;
wherein the cylinder includes an opening configured to accept a conductor passed therethrough.

36. The magnetic component assembly of claim 35, wherein the magnetic core element is fabricated from a single, thin sheet of magnetic material having a thickness less than about 2.0 mm.

37. The magnetic component assembly of claim 35, wherein the magnetic core element is fabricated from a single, thin sheet of magnetic material having a thickness of about 1 mm.

38. The magnetic component assembly of claim 35, wherein the magnetic core element is fabricated from a single, thin sheet of magnetic material comprising an unoriented, 80% nickel molybdenum alloy.

39. The magnetic component assembly of claim 35, further comprising a Hall element placed in the gap.

40. The magnetic component assembly of claim 35, further comprising a circuit board, wherein the circuit board in combination with the Hall element, is configured to measure a current flowing through the conductor.

41. The magnetic component of claim 40, further comprising a housing having a height dimension and a length dimension, and a major plane of the circuit board extending perpendicular to the height dimension.

42. The magnetic component assembly of claim 35, wherein the magnetic core element has an inner diameter, and wherein a ratio of the inner diameter to the thickness is greater than or equal to 10:1.

43. The magnetic component assembly of claim 35 wherein the cylinder has an outer radius of about 16 mm.

44. The magnetic component assembly of claim 35, further comprising a housing, and the magnetic core element assembled to the housing.

45. The magnetic component assembly of claim 44, wherein the housing has a length of about 25 mm or less.

46. The magnetic component assembly of claim 45, wherein the housing has a length of about 18 mm.

47. The magnetic component assembly of claim 45, wherein the housing has a rear wall, an inner wall projecting from the rear wall, and an intermediate wall projecting from the rear wall, and wherein the magnetic core element is received between the inner wall and the intermediate wall.

48. The magnetic component assembly of claim 35, wherein the component is configured as a non-contact current sensor.

49. The magnetic component assembly of claim 47, wherein the component is configured as an open loop Hall effect current sensor.

50. A magnetic component assembly comprising:
a housing formed with a passageway; and
a planar magnetic core element assembled to the housing around the passageway, the planar magnetic core element having a thickness from about 0.3 mm to about 3 mm, the planar magnetic core element formed with an outer periphery and an inner periphery, and a gap extending from the outer periphery to the inner periphery.

51. The magnetic component assembly of claim 50, wherein the outer periphery includes at least one straight side and at least one rounded corner.

52. The magnetic component assembly of claim 50, wherein the magnetic core element has a thickness of about 1 mm.

53. The magnetic component assembly of claim 50, further comprising a Hall element placed in the gap.

54. The magnetic component assembly of claim 53, further comprising a circuit board assembled in the housing.

55. The magnetic component assembly of claim 54, wherein the housing comprises a rear wall and an inner wall projecting from the rear wall, the magnetic core element assembled to the inner wall and a major plane of the circuit board extending parallel to the rear wall.

56. The magnetic component assembly of claim 50, wherein the component is configured as a non-contact current sensor.

57. The magnetic component assembly of claim 56, wherein the component is configured as an open loop Hall effect current sensor.

* * * * *